(12) United States Patent
Imoto et al.

(10) Patent No.: US 10,372,029 B2
(45) Date of Patent: Aug. 6, 2019

(54) REFLECTIVE MASK, REFLECTIVE MASK BLANK, AND MANUFACTURING METHOD THEREFOR

(71) Applicant: TOPPAN PRINTING CO., LTD., Tokyo (JP)

(72) Inventors: Tomohiro Imoto, Tokyo (JP); Norihito Fukugami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 465 days.

(21) Appl. No.: 15/138,960

(22) Filed: Apr. 26, 2016

(65) Prior Publication Data

US 2017/0306475 A1    Oct. 26, 2017

(51) Int. Cl.
| | |
|---|---|
| *G03F 1/24* | (2012.01) |
| *C23C 14/04* | (2006.01) |
| *C23C 16/04* | (2006.01) |
| *C23C 28/00* | (2006.01) |

(52) U.S. Cl.
CPC .............. *G03F 1/24* (2013.01); *C23C 14/042* (2013.01); *C23C 16/042* (2013.01); *C23C 28/00* (2013.01)

(58) Field of Classification Search
CPC ................................ G03F 1/24; C23C 16/042
USPC ............................................................ 430/5
See application file for complete search history.

(56) References Cited

U.S. PATENT DOCUMENTS

2009/0220869 A1    9/2009    Takai

FOREIGN PATENT DOCUMENTS

| JP | 2009-212220 A | 9/2009 |
| JP | 2012-049498 A | 3/2012 |
| JP | 2013-187412 A | 9/2013 |

OTHER PUBLICATIONS

Office Action dated Jun. 6, 2017 in Japanese Patent Application No. 2013-219217.

*Primary Examiner* — Christopher G Young
(74) *Attorney, Agent, or Firm* — Foley & Lardner LLP

(57) ABSTRACT

There are provided a reflective mask and a reflective mask blank reducing reflection of out-of-band light and a manufacturing method therefor. A light shielding frame is formed on a mask region corresponding to a multiply exposed boundary region between a chip and a semiconductor substrate. The frame is provided with an antireflective layer causing surface reflection in antiphase to out-of-band light reflected from the surfaces of a rear-surface conductive film and the substrate to provide a reflective mask reducing reflection of out-of-band light. The antireflective layer of the present disclosure has an electrical conductivity of $1\times10^4/$ m$\Omega$ or greater to minimize charging occurring in a pattern region in observing the region using an electron microscope.

8 Claims, 5 Drawing Sheets

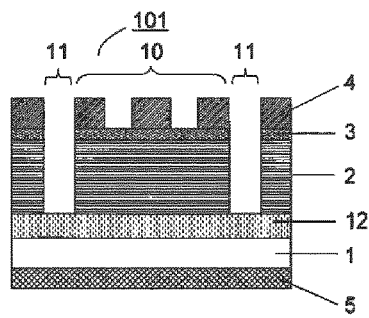
FIG.1A
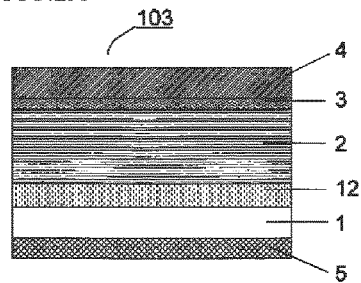
FIG.2A
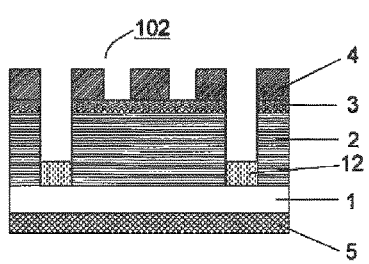
FIG.1B
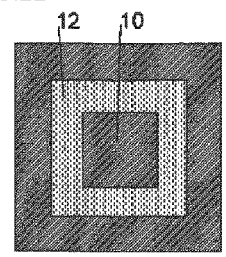
FIG.2B
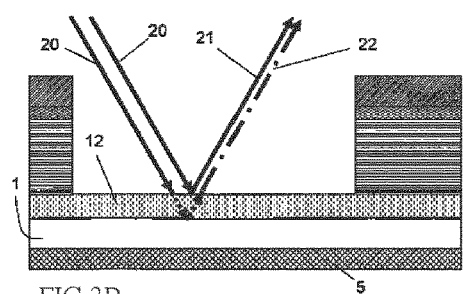
FIG.3A
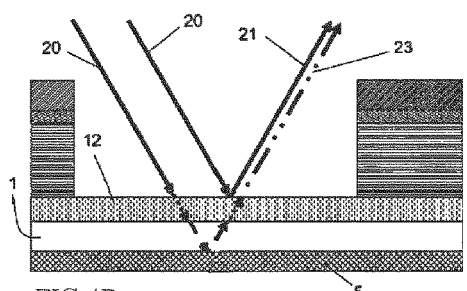
FIG.4A
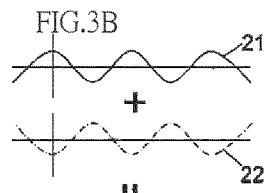
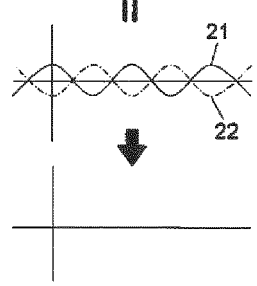
FIG.3B
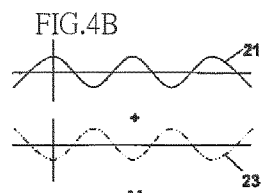
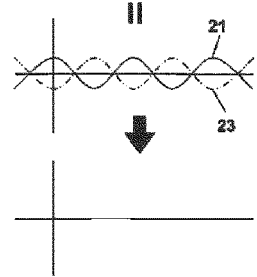
FIG.4B

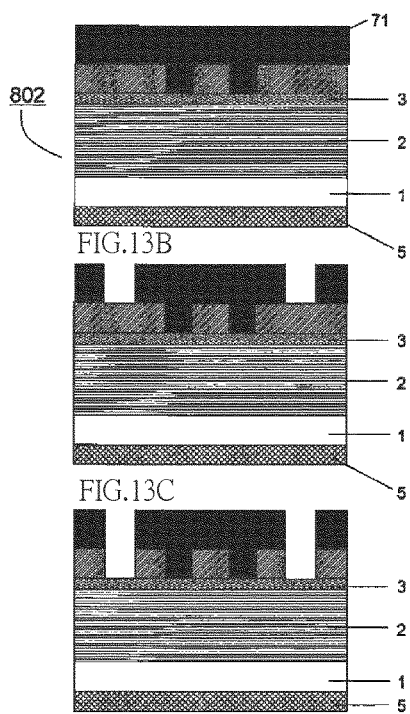
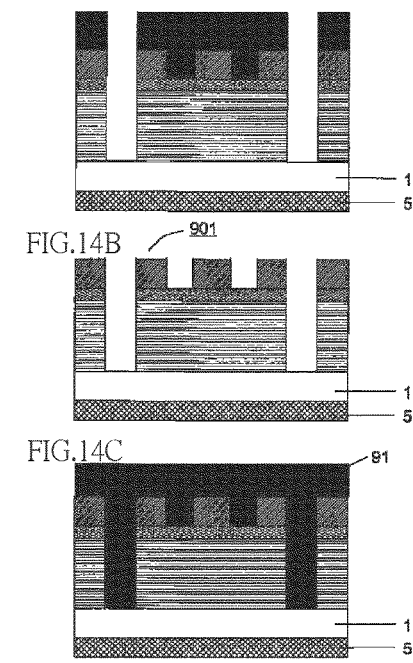
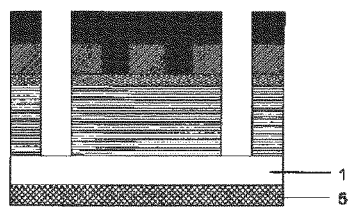
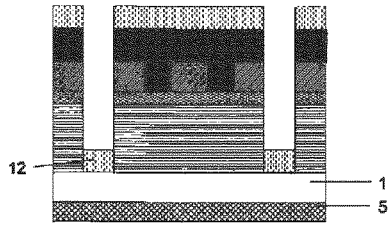
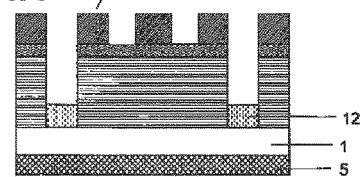
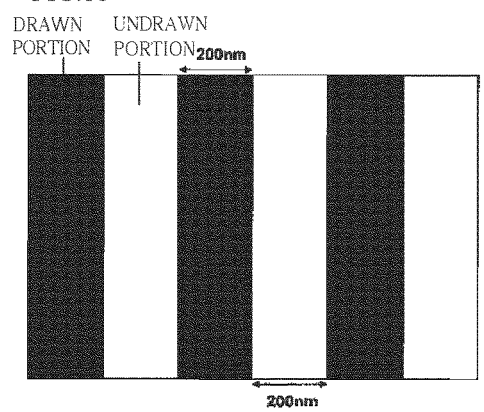

100# REFLECTIVE MASK, REFLECTIVE MASK BLANK, AND MANUFACTURING METHOD THEREFOR

TECHNICAL FIELD

The present disclosure relates to a reflective mask and a reflective mask blank, and more specifically to a reflective mask, a reflective mask blank, and a manufacturing method therefor for use in a semiconductor fabrication apparatus, for example, which employs extreme ultraviolet (hereinafter referred to as EUV) lithography in which EUV is used as a light source.

BACKGROUND

There has been a trend in recent years to provide finer structures for semiconductor devices. With this trend, there has been proposed EUV lithography in which EUV light having a wavelength of approximately 13.5 nm is used as a light source. EUV lithography, in which the light-source wavelength is short and light absorbency is very high, has to be conducted in a vacuum. In the EUV wavelength range, most substances have a refractive index slightly smaller than 1. Therefore, EUV lithography cannot use transmissive optics of conventional art, but has to use reflective optics. Therefore, in EUV lithography, conventional transmission-type masks cannot be used as a photomask (hereinafter referred to as a mask) that is an original plate, but reflective-type masks have to be used.

A reflective mask blank, which is an original mask of such a reflective-type mask, includes a multi-layer reflective layer and an absorbing layer formed in this order on a low thermal expansion substrate. The multi-layer reflective layer has a high reflectance relative to the wavelength of an exposure light source. The absorbing layer absorbs the wavelength of the exposure light source. The substrate has a rear surface on which a rear-surface conductive film is formed as an electrostatic chuck in an exposure device. There is also an EUV mask having a structure in which a buffer layer is provided between a multi-layer reflective layer and an absorbing layer. In processing a reflective mask blank into a reflective mask, the absorbing layer is partially removed by electron beam (EB) lithography and etching. In the case of the structure having a buffer layer, the absorbing layer is similarly removed to form a circuit pattern composed of absorbing portions and reflecting portions. An optical image reflected by the reflective mask thus prepared is transferred onto a semiconductor substrate by way of a reflective optics.

In exposure methods using a reflective optics, light is applied to a mask surface at an incident angle which is inclined by a predetermined angle (usually 6°) relative to a normal direction. Accordingly, in the case where the thickness of the absorbing layer is large, the incident light casts a shadow of the pattern on the semiconductor substrate. Since the shadowed portions will have reflection intensity smaller than in the unshadowed portions, contrast is lowered in the transferred pattern, causing blurred edges or displacement from designed dimensions. This is called shadowing, which is one of the problems inherent to reflective masks.

In order to prevent blur in the pattern edges or displacement from designed dimensions, an effective way is to reduce the thickness of the absorbing layer and the height of the pattern. However, a reduced thickness of the absorbing layer degrades the light shielding properties of the absorbing layer, and also degrades transfer contrast and accuracy in the transferred pattern. In other words, when the absorbing layer is too thin, the contrast necessary to keep the accuracy in the transferred pattern will no longer be obtained. In other words, an absorbing layer, which is excessively thick or thin, can cause problems. Therefore, the thickness of the absorbing layer recently is in a range of about 50 to 90 nm, with the reflectance to extreme ultraviolet light (EUV light) of the absorbing layer being in a range of about 0.5 to 2%.

On the other hand, in transferring a circuit pattern onto a semiconductor substrate using a reflective mask, a plurality of chips having respective circuit patterns are formed on a single semiconductor substrate. Between adjacent chips, there may be a region where the outer peripheral portions of the chips overlap with each other. This is caused by the high-density arrangement of the chips, which is based on the idea of producing as many chips as possible per wafer to improve productivity. In this case, the overlapped region will be exposed a plurality of times, four times at maximum (multiple exposure). The outer peripheral portion of each chip of the transferred pattern is also an outer peripheral portion on the mask, which is usually included in the absorbing layer. However, as described above, since the reflectance of EUV light of the absorbing layer is in a range of about 0.5 to 2%, the outer peripheral portion of each chip is problematically multiply exposed. Therefore, it is necessity to provide a region in the outer peripheral portion of each chip on the mask where the effect of shielding EUV light is higher than in a commonly used absorbing layer (hereinafter the region is referred to as a light shielding frame).

To solve such problems, there is proposed a reflective mask in which a groove is formed penetrating the absorbing layer and the multi-layer reflective layer of a reflective mask, to thereby lower the reflectance of the multi-layer reflective layer and to provide a light shielding frame having high light shielding properties against the wavelength of an exposure light source (e.g. see JP-A-2009-212220).

However, the EUV light source, which has a radiation spectrum peak at a wavelength of 13.5 nm, is known to also radiate light ranging from vacuum ultraviolet light to near ultraviolet light at a wavelength of 140 to 400 nm, which is called out-of-band light. In the light shielding frame 11 proposed in JP-A-2009-212220, the out-of-band light is transmitted, as shown in FIG. 19, through the substrate 1, and reflected off the rear-surface conductive film 5 which is made such as of chromium nitride (CrN) and formed on the EUV mask on a side opposite to a pattern side. Then, the out-of-band light is again transmitted through the substrate, for radiation, toward a semiconductor substrate to problematically expose the resist coated on the semiconductor substrate. Further, pattern regions are electrically isolated by forming the light shielding frame, raising a problem of charging during observation using an electron microscope.

SUMMARY OF THE INVENTION

The present disclosure has been made in light of the problems set forth above and has as its object to provide a reflective mask and a reflective mask blank that can reduce reflection of out-of-band light in a mask region corresponding to each chip's boundary region multiply exposed in a semiconductor substrate, and minimize charging occurring during observation using an electron microscope, and to provide a manufacturing method therefor.

A first aspect of the present disclosure is a reflective mask blank including a substrate; a multi-layer reflective layer formed on a front surface of the substrate; a protective layer formed on the multi-layer reflective layer; and an absorbing layer formed on the protective layer. In the reflective mask blank, the absorbing layer is provided with a circuit pattern region having an outer portion which at least partially includes a light shielding frame having low reflectivity to EUV light and out-of-band light, with the absorbing layer, the protective layer and the multi-layer reflective layer being removed from the outer portion. The substrate within the light shielding frame is provided thereon with an antireflective layer.

A second aspect of the present disclosure is the reflective mask blank according to the first aspect, in which the antireflective layer causes surface reflection in antiphase to out-of-band light reflected from a rear-surface conductive film formed on a rear surface of the substrate.

A third aspect of the present disclosure is the reflective mask blank according to the first or second aspect, in which the antireflective layer causes surface reflection in antiphase to out-of-band light reflected from the front surface of the substrate.

A fourth aspect of the present disclosure is the reflective mask blank according to any one of the first to third aspects, in which the antireflective layer is made of an inorganic material, and designed on the basis of a combination of a film thickness and a refractive index providing an optical interference effect.

A fifth aspect of the present disclosure is the reflective mask blank according to the fourth aspect, in which the inorganic material of the antireflective layer is a material containing at least any of Si, Mo, Ta, Cr, Ru, Al, Ti, Zn, Sn, Hf, W, Zr, and Cu.

A sixth aspect of the present disclosure is the reflective mask blank according to any one of the first to fifth aspects, in which the antireflective layer has an electrical conductivity of $1 \times 10^4/\text{m}\Omega$ or greater.

A seventh aspect of the present disclosure is a manufacturing method for the reflective mask blank according to any of the first to sixth aspects, in which the antireflective layer is formed by using any of sputtering, physical vapor deposition (PVD), ion plating, and chemical vapor deposition (CVD).

An eighth aspect of the present disclosure is a manufacturing method for the reflective mask blank according to any of the first to sixth aspects, in which the antireflective layer is formed on the substrate prior to forming the multi-layer reflective layer.

A ninth aspect of the present disclosure is a manufacturing method for the reflective mask blank according to any of the first to sixth aspects, in which the antireflective layer is formed on exposed parts of the substrate exposed after partially removing the multi-layer reflective layer.

A tenth aspect of the present disclosure is a reflective mask, in which the absorbing layer of the reflective mask blank according to any of the first to sixth aspects is patterned.

The light shielding frame is formed on the mask region corresponding to the boundary region of a chip which is multiply exposed on a semiconductor substrate. The antireflective layer is provided so as to cause surface reflection in antiphase to the out-of-band light reflected from the rear-surface conductive film and the front surface of the substrate. With this configuration, a reflective mask reducing reflection of the out-of-band light can be provided.

In a mask having a light shielding band based on conventional art, a pattern region is electrically floated by forming a light shielding band. This raises a problem of charging in a pattern region occurring during observation using electron beams, in an inspection using an electron beam mask inspection device, or in an exposure using an EUV exposure device. However, since the antireflective layer of the present disclosure has electrical conductivity, the charging of a pattern region due to the light shielding band can be minimized.

Use of the reflective mask configured in this way can enhance the dimensional accuracy of a semiconductor pattern and improve the productivity of semiconductors and the like.

BRIEF DESCRIPTION OF THE DRAWINGS

In the accompanying drawings:

FIGS. 1A and 1B are schematic cross sectional views each illustrating a structure of a reflective mask according to the present disclosure;

FIG. 2A is a schematic cross sectional view illustrating a structure of a reflective mask blank according to the present disclosure;

FIG. 2B is a schematic plan view illustrating a reflective mask according to the present disclosure;

FIG. 3A is a schematic side view illustrating a mask reducing out-of-band light reflected from a substrate by means of an antireflective layer according to the present disclosure;

FIG. 3B is a diagram illustrating a relationship between surface-reflected light and interface-reflected light;

FIG. 4A is a schematic side view illustrating a mask reducing out-of-band light reflected from a rear-surface conductive film by means of an antireflective layer according to the present disclosure;

FIG. 4B is a diagram illustrating a relationship between surface-reflected light and interface-reflected light

FIGS. 13A to 13C are schematic plan views each illustrating a part of the fabrication step 2 (light shielding frame formation) for a reflective mask according to an example of the present disclosure;

FIGS. 14A to 14C are schematic plan views each illustrating another part of the fabrication step 2 (light shielding frame formation) for a reflective mask according to an example of the present disclosure;

FIGS. 15A to 15C are schematic plan views each illustrating still another part of the fabrication step 2 (light shielding frame formation) for a reflective mask according to an example of the present disclosure;

FIG. 16 is a schematic plan view illustrating an evaluation pattern according to an example of the present disclosure;

DESCRIPTION OF REPRESENTATIVE EMBODIMENTS

Figure 5A:
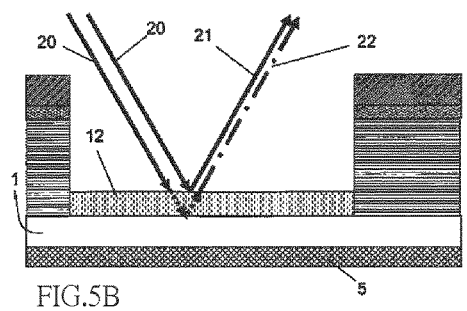
FIG. 5A is a schematic side view illustrating a mask reducing out-of-band light reflected from a substrate by means of an antireflective layer provided only to a light shielding frame portion according to the present disclosure.

With reference to the accompanying drawings, hereinafter will be described an example of the present disclosure. However, it is noted that this example is only representative of the disclosed invention and the disclosed invention is necessarily limited to these embodiments.

First, a configuration, as an example, of a reflective mask of the present disclosure will be described. FIGS. 1A and 1B are schematic cross sectional views each illustrating a structure of the reflective mask according to the present disclosure. FIG. 2A is a schematic cross sectional view illustrating a structure of the reflective mask blank according to the present disclosure. FIG. 2B is a schematic plan view illustrating a reflective mask according to the present disclosure, when the structure shown in FIGS. 1A and 1B are viewed from above. A configuration as an example of the reflective mask of the present disclosure is indicated by 101 or 102.

In the reflective mask 101 shown in FIG. 1A, an antireflective layer 12, a multi-layer reflective layer 2, a protective layer 3, an absorbing layer 4, a pattern region 10, and a light shielding frame 11 are formed in this order on a front surface of a substrate 1. In the reflective mask 102 shown in FIG. 1B, a multi-layer reflective layer 2, a protective layer 3, an absorbing layer 4, a pattern region 10, and a light shielding frame 11 are formed in this order on a front surface of a substrate 1, with an antireflective layer 12 being formed only on the light shielding frame 11. In a reflective mask blank 103 shown in FIG. 2A, an antireflective layer 12, a multi-layer reflective layer 2, a protective layer 3, and an absorbing layer 4 are formed in this order on a front surface of a substrate 1. In the structure, the substrate has a rear surface which is formed with a rear-surface conductive film 5. A buffer layer may be provided between the protective layer 3 and the absorbing layer 4. The buffer layer is provided to prevent the protective layer 3, as a primer layer, from being damaged when the mask pattern on the absorbing film 4 is repaired.

The reflective masks 101 and 102 according to the present disclosure each have a region in which the antireflective layer 12 causes surface reflection in antiphase to out-of-band light reflecting off the interface between the rear-surface conductive film 5 and the substrate 1 in a light shielding frame region and reflecting off the front surface of the substrate 1.

In the present disclosure, the material and the thickness of the antireflective layer 12 are adjusted to cause antiphase reflection therein with respect to out-of-band light reflecting off the interface between the rear-surface conductive film 5 and the substrate 1 and reflecting off the front surface of the substrate 1. Specifically, the refractive index and the thickness of a material of the antireflective layer 12 only have to be selected and adjusted so as to satisfy the following Conditional Expression (1) for reducing light intensity using thin-film interference:

$$2nd \cos \theta = m\lambda \tag{1}$$

where n indicates refractive index, d indicates film thickness, θ indicates incident angle, and λ indicates wavelength (m=0, 1, 2, . . . ).

FIG. 3A is a schematic side view illustrating a mask of the present disclosure which reduces out-of-band light 20 reflected from the substrate 1, by means of the antireflective layer 12. When the out-of-band light 20 is incident on the antireflective layer 12, interface-reflected light 22 reflecting off the substrate 1 is in antiphase to surface-reflected light 21 reflecting off the antireflective layer 12. Thus, as shown in FIG. 3B, the two lights cancel each other out by interference, thereby reducing reflection of the out-of-band light 20. The antiphase relationship between the interface-reflected light 22 and the surface-reflected light 21 can be achieved by adjusting the material or the thickness of the antireflective layer 12.

FIG. 4A is a schematic side view illustrating a mask of the present disclosure reducing the out-of-band light 20 reflected from the rear-surface conductive film 5, by means of the antireflective layer 12. When the out-of-band light 20 is incident on the antireflective layer 12, the antireflective layer 12 causes interface-reflected light 23 reflecting off the rear-surface conductive film 5 to be in antiphase to the surface-reflected light 21. Thus, as shown in FIG. 4B, the two lights cancel each other out by interference, thereby reducing reflection of the out-of-band light 20. The antiphase relationship between the interface-reflected light 23 and the surface-reflected light 21 can be achieved by adjusting the material or the thickness of the antireflective layer 12.

Figure 5B:
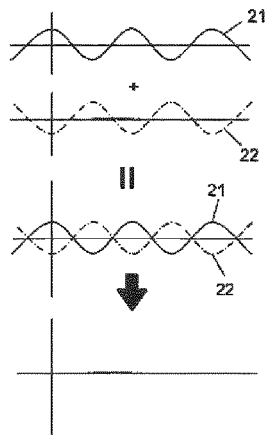
FIG. 5B is a diagram illustrating a relationship between surface-reflected light and interface-reflected light

FIG. 5A is a schematic side view illustrating a mask of the present disclosure reducing the out-of-band light 20 reflected from the substrate 1, by means of the antireflective layer 12 formed only on the light shielding frame portion. When the out-of-band light 20 is incident on the antireflective layer 12, the antireflective layer 12 causes interface-reflected light 22 reflecting off the substrate 1 to be in antiphase to surface-reflected light 21. Thus, as shown in FIG. 5B, the two lights cancel each other out by interference, thereby reducing reflection of the out-of-band light 20. The antiphase relationship between the interface-reflected light 22 and the surface-reflected light 21 can be achieved by adjusting the material or the thickness of the antireflective layer 12.

Figure 6A:
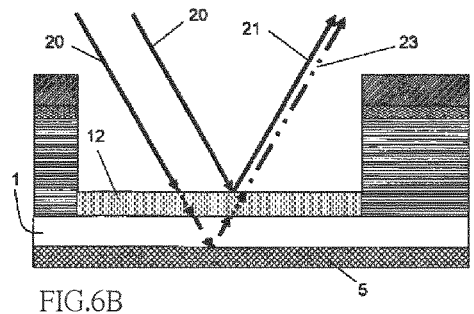
FIG. 6A is a schematic side view illustrating a mask reducing out-of-band light reflected from a rear-surface conductive film by means of an antireflective layer provided only to a light shielding frame according to the present disclosure.
Figure 6B:
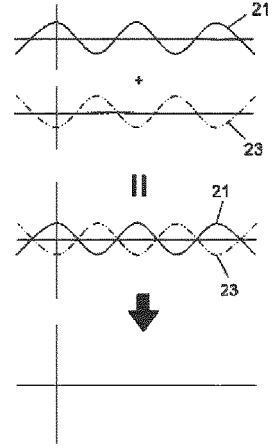
FIG. 6B is a diagram illustrating a relationship between surface-reflected light and interface-reflected light

FIG. 6A is a schematic side view illustrating a mask of the present disclosure reducing the out-of-band light 20 reflected from the rear-surface conductive film 5, by means of the antireflective layer 12 formed only on the light shielding frame portion. When the out-of-band light 20 is incident on the antireflective layer 12, the antireflective layer 12 causes interface-reflected light 23 reflecting off the rear-surface conductive film 5 to be in antiphase to surface-reflected light 21. Thus, as shown in FIG. 6B, two lights cancel each other out by interference, thereby reducing reflection of the out-of-band light 20. The antiphase relationship between the interface-reflected light 23 and the surface-reflected light 21 can be achieved by adjusting the material or the thickness of the antireflective layer 12.

Any materials can be used for the antireflective layer 12 of the present disclosure as long as the materials have a refractive index and a thickness satisfying Conditional Expression (1) set forth above. However, since the materials used for the antireflective layer 12 need to be tolerant of a vacuum or EUV light, chemically stable inorganic materials are used. Specifically, those materials which contain Si, Mo, Ta, Cr, Ru, Al, Ti, Zn, Sn, Hf, W, Zr, or Cu are used.

The antireflective layer 12 of the present disclosure may be made of oxides, nitrides, or oxynitrides of the above materials. This is because, to improve the effects of interference of antiphase light, the amplitude is desirably reasonably large. Thus, for reducing the attenuation coefficient, this is an effective method.

The antireflective layer 12 of the present disclosure has an electrical conductivity of $1 \times 10^4$/m$\Omega$ or greater. This is for solving the problem of charging in the pattern region occurring during observation and measurement of dimensions using electron beams, in an inspection using an electron beam mask inspection device, or in an exposure using an EUV exposure device, due to the pattern region electrical floating caused by forming a light shielding band.

Preferably, the antireflective layer 12 of low reflection of the present disclosure is formed on a substrate prior to forming the multi-layer reflective layer 2 because the number of processing steps is not so increased. Alternatively, however, the antireflective layer 12 may be formed on the exposed substrate after partially removing the multi-layer reflective layer.

The multi-layer reflective layer 2 shown in FIG. 1A is designed to achieve reflectivity of about 60% relative to EUV light. The multi-layer reflective layer 2 is a laminate film in which 40 to 50 pairs of Mo and Si layers are alternately laminated. The protective layer 3, which is an upper layer, is made of ruthenium (Ru) with a thickness of 2 to 3 nm or silicon (Si) with a thickness of about 10 nm. A Si layer is disposed adjacently below a Ru layer. The reason why Mo and Si are used is that Mo and Si have a small absorbance for EUV light (small attenuation coefficient) and the refractive index difference for EUV light is large between Mo and Si, and thus the reflectivity can be increased in the interface of Si to Mo. The protective layer 3, when made of Ru, serves as a stopper in processing the absorbing layer 4 or a protective layer against a chemical solution in cleaning the mask. When the protective layer 3 is made of Si, a buffer layer may be provided between the protective layer 3 and the absorbing layer 4. The buffer layer is provided to protect the Si layer in etching the absorbing layer 4 or in repairing the pattern. The Si layer is the topmost layer of the multi-layer reflective layer 2 adjacently below the buffer layer. The buffer layer is made of chromium (Cr) or a nitrogen compound (CrN).

The absorbing layer 4 shown in FIG. 1A is made of a nitrogen compound (TaN) of tantalum (Ta) having a high absorption index for EUV. As other materials for the absorbing layer 4, mention can be made of tantalum boron nitride (TaBN), tantalum silicon (TaSi), tantalum (Ta), or oxides of these materials (TaBON, TaSiO and TaO).

The absorbing layer 4 shown in FIG. 1A may have a two-layer structure including a low reflective layer as an upper layer which is antireflective for ultraviolet rays at a wavelength of 190 to 260 nm. The low reflective layer is provided to enhance contrast at the inspection wavelengths of a mask defect inspection device and to improve inspectability.

The rear-surface conductive film 5 shown in FIG. 1A is typically made of CrN. Since the rear-surface conductive film 5 only has to be electrically conductive, any metallic material can be used. In FIG. 1A, the reflective mask is illustrated as including the conductive film 5. However, there may be provided a mask blank and a mask including no rear-surface conductive film 5.

Figure 7A:
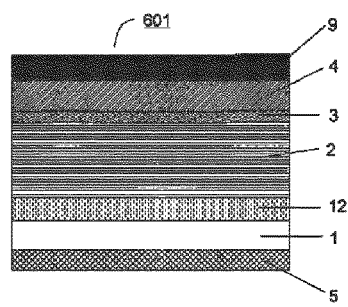
FIGS. 7A and 7B are schematic cross sectional views each illustrating a part of a fabrication step 1 (pattern formation) for a reflective mask according to an example of the present disclosure.
Figure 8A:
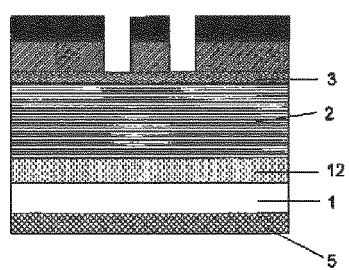
FIGS. 8A and 8B are schematic cross sectional views each illustrating another part of the fabrication step 1 (pattern formation) for a reflective mask according to an example of the present disclosure.

A manufacturing method 1 for the reflective mask of the present disclosure will be described. First, a resist 9 is coated onto the reflective mask blank 103 having the antireflective layer shown in FIG. 2A (see FIG. 7A). Then, a pattern is formed on a main region shown in FIG. 7B by photolithography or electron-beam lithography. Following the pattern, the absorbing layer 4 is treated by dry etching using a fluorine-containing gas or a chlorine gas, or using both of them, or by wet etching using an alkaline solution or an acid solution (see FIG. 8A). Then, the resist 9 is removed and cleaned, thereby forming a reflective mask 602 with a pattern being formed on the main region (see FIG. 8B).

Figure 9A:
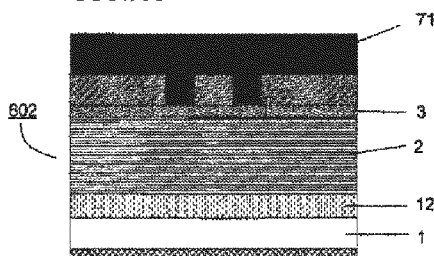
FIGS. 9A and 9B are schematic plan views each illustrating a part of the fabrication step 1 (light shielding frame formation) for a reflective mask according to an example of the present disclosure.
Figure 9B:
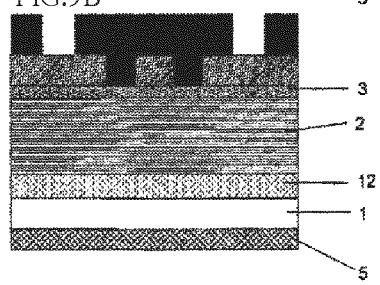
Figure 10A:
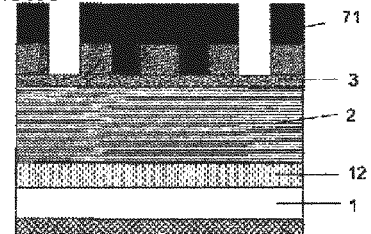
FIGS. 10A to 10C are schematic plan views each illustrating another part of the fabrication step 1 (light shielding frame formation) for a reflective mask according to an example of the present disclosure.

A forming method 1 for the light shielding frame of the reflective mask of the present disclosure will be described. First, a resist 71 is coated onto the reflective mask 602 having the antireflective layer (see FIG. 9A). Then, a resist pattern in which only a light shielding frame portion is open is formed by photolithography or electron-beam lithography (see FIG. 9B). Then, the absorbing film 4 in the opening of the resist pattern is removed by dry etching using a fluorine-containing gas or a chlorine gas (or both of them) (see FIG. 10A). Then, the protective layer 3 and the multi-layer reflective layer 2 are penetrated and removed by dry etching using a fluorine-containing gas or a chlorine gas, or using both of them, or by wet etching using an alkaline solution or an acid solution (see FIG. 10B). Then, the resist 71 is removed and cleaned, thereby forming a reflective mask 701 having a light shielding frame and an antireflective layer, with a pattern being formed on the main region (see FIG. 10C).

Figure 11A:
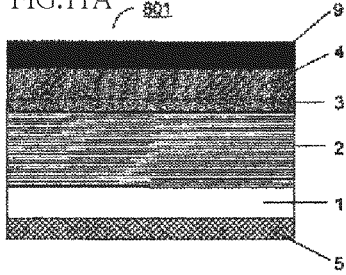
FIGS. 11A and 11B are schematic cross sectional views each illustrating a part of a fabrication step 2 (pattern formation) for a reflective mask according to an example of the present disclosure.
Figure 11B:
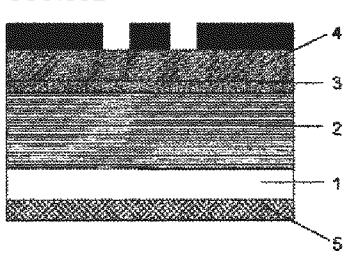
Figure 12A:
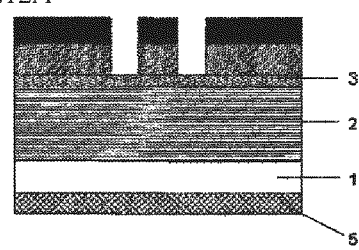
FIGS. 12A and 12B are schematic cross sectional views each illustrating another part of the fabrication step 2 (pattern formation) for a reflective mask according to an example of the present disclosure.
Figure 12B:
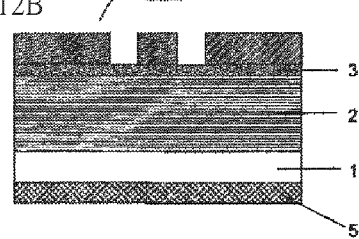

A manufacturing method 2 for the reflective mask of the present disclosure will now be described. In the structure shown in FIG. 11A, the multi-layer reflective layer 2, the protective layer 3, the absorbing layer 4, and the resist 9 are formed in this order on the front surface of the substrate 1, with the rear-surface conductive film 5 being formed on the rear surface of the substrate 1. Then, a pattern is formed on the main region shown in FIG. 11B by photolithography or electron-beam lithography. Following the pattern, the absorbing layer 4 is treated by dry etching using a fluorine-containing gas or a chlorine gas, or using both of them, or by wet etching using an alkaline solution or an acid solution (see FIG. 12A). Then, the resist 9 is removed and cleaned, thereby forming a reflective mask 802, with a pattern being formed on the main region (see FIG. 12B).

A forming method 2 for the light shielding frame of the reflective mask of the present disclosure will be described.

First, a resist 71 is coated onto the reflective mask 802 (see FIG. 13A). Then, a resist pattern in which only a light shielding frame portion is open is formed by photolithography or electron-beam lithography (see in FIG. 13B). Then, the absorbing film 4 in the opening of the resist pattern is removed by dry etching using a fluorine-containing gas or a chlorine gas (or both of them) (see FIG. 13C). Then, the protective layer 3 and the multi-layer reflective layer 2 are penetrated and removed by dry etching using a fluorine-containing gas or a chlorine gas, or both of them, or by wet etching using an alkaline solution or an acid solution (see FIG. 14A). Then, the resist 71 is removed and cleaned, thereby forming a reflective mask 901 having a light shielding frame, with a pattern being formed on the main region (see FIG. 14B). Further, a resist 91 is coated onto the reflective mask 901 (see FIG. 14C). Then, a resist pattern in which only a light shielding frame portion is open is formed by photolithography or electron-beam lithography (see FIG. 15A). Then, the antireflective layer 12 is formed using any of sputtering, physical vapor deposition (PVD), ion plating, and chemical vapor deposition (CVD) (see FIG. 15B). Finally, the resist 91 is removed and cleaned, thereby forming the reflective mask 902 having a light shielding frame and an antireflective layer, with a pattern being formed on the main region (see FIG. 15C).

In penetrating and removing the multi-layer reflective layer 2 by dry etching, a fluorine-containing gas or a chlorine gas, or both of them are used. The reason for this is that these gases have etching properties for both of Mo and Si which are materials for the multi-layer reflective layer. As the fluorine-containing gas used in this case, mention can be made of $CF_4$, $C_2F_6$, $C_4F_8$, $C_5F_8$, $CHF_3$, $SF_6$, $ClF_3$, or the like. A chlorine gas can be $Cl_2$ or HCl.

The etchant used in penetrating and removing the multi-layer reflective layer 2 by wet etching has to be suitable for etching Mo and Si which are materials of the multi-layer reflective layer 2. For example, suitable alkaline solutions that can be used include tetramethyl ammonium hydroxide (TMAH), potassium hydroxide (KOH), and ethylene diamine pyrocatechol (EDP). As the acid solution, a mixture of nitric acid and phosphoric acid is suitable. Hydrogen fluoride, sulfuric acid, or acetic acid may be added to the mixture.

The antireflective layer is made of an inorganic material at least containing Si, Mo, Ta, Cr, Ru, Al, Ti, Zn, Sn, Hf, W, Zr, or Cu and having an electrical conductivity of $1\times10^4/m\Omega$ or greater.

As described above, in EUV masks having a light shielding region with a multi-layer reflective layer being removed, there can be obtained a reflective mask which reduces reflection of out-of-band light, and minimizes charging occurring during observation using an electron microscope, in an inspection using an electron beam mask inspection device, or in an exposure using an EUV exposure device.

EXAMPLE

Hereinafter is described an example of a manufacturing method for the reflective mask of the present disclosure. In the example, a reflective mask blank 601 having the antireflective layer 12 shown in FIG. 2A was prepared. In the blank, an antireflective layer 12, a multi-layer reflective layer 2, a protective layer 3 and an absorbing layer 4 were formed in this order on a substrate 1. The antireflective layer 12 was made of MoSiON containing Mo, Si, O, and N. The multi-layer reflective layer 2 included 40 pairs of Mo and Si designed in such a way that the reflectivity was about 64% for EUV light having a wavelength of 13.5 nm. The protective layer 3 was made of Ru with a thickness of 2.5 nm. The absorbing layer 4 was made of TaSi with a thickness of 70.

A thickness d of the antireflective layer 12 is determined using the following Conditional Expression (2) modified from Conditional Expression (1) for reducing light intensity using thin-film interference. In Conditional Expression (2), n indicates a refractive index and m is an integer. The antireflective layer 12 made of MoSiON of the present disclosure causes out-of-band light at a wavelength 300 nm, with the refractive index n of 2.26, an incident angle of 6°, and the integer m of 1. When these values are substituted into Conditional Expression (2), d is about 66.7 nm. Therefore, the antireflective layer was formed by sputtering with a thickness of 67 nm.

$$d=m\lambda/2n \cos\theta \qquad (2)$$

Figure 7B:
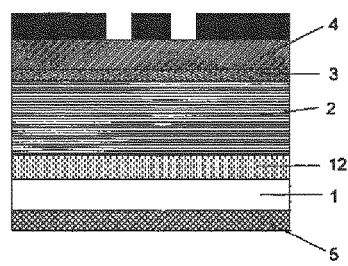

Onto this blank, a positive chemically amplified resist 9 (FEP171 manufactured by FUJIFILM Electronic Materials Co., Ltd.) was coated with a thickness of 300 nm (see FIG. 7A), and drawing was performed using an electron beam lithographic machine (JBX9000 manufactured by JEOL Ltd.), followed by post exposure baking (PEB) at 110° C. for 10 minutes and spray development (SFG3000 manufactured by Sigmameltec LTD.), thereby forming a resist pattern on a main region shown in FIG. 7B.

Figure 8B:
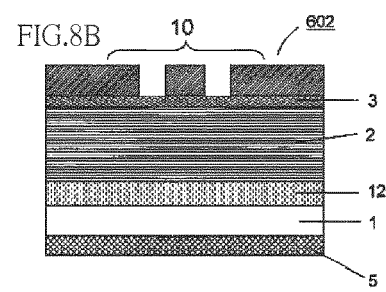

Then, the absorbing layer 4 was etched with $CF_4$ plasma and $Cl_2$ plasma using a dry etching device (see FIG. 8A), and then the resist was removed and cleaned, thereby preparing a reflective mask 602 with an evaluation pattern shown in FIG. 8B. The evaluation pattern was disposed at the center of the mask, using a 1:1 line-and-space pattern with a pitch of 200 nm shown in FIG. 16. The size of the pattern region was 10 cm×10 cm.

Then, a light shielding frame was formed on a pattern region 10 of the reflective mask 602 having the evaluation pattern. Specifically, an i-line resist 71 was coated onto the reflective mask 602 (see FIG. 8B) with a thickness of 500 nm (see FIG. 9A), followed by drawing using an i-line lithographic machine (ALTA) and development, thereby forming a resist pattern in which a region serving as a light shielding frame later was drawn (see FIG. 9B). In this case, the resist pattern was permitted to have an opening width of 5 mm and was disposed three micrometers apart from the main pattern region of 10 cm×10 cm at the center of the mask.

Figure 10B:
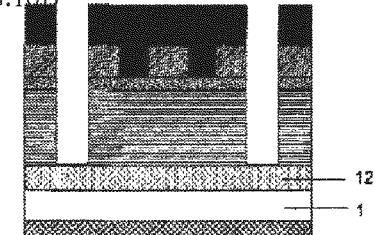

Then, the resist pattern was subjected to vertical dry etching with $CHF_3$ plasma by means of a dry etching device to penetrate the absorbing layer 4, the protective layer 3, and the multi-layer reflective layer 2 in the opening of the resist (see FIGS. 10A and 10B), thereby obtaining a shape shown in FIG. 10B. In the dry etching device, the pressure was 50 mTorr, the inductively coupled plasma (ICP) power was 500 W, the reactive ion etching (ME) power was 200 W, and the $CHF_3$ flow rate was 20 sccm. The duration of treatment was 6 minutes. These conditions also apply to the following description.

Figure 10C:
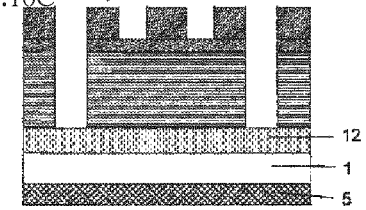

Finally, the resist was removed and cleaned with a sulfuric acid-based stripping solution and an ammonia-hydrogen peroxide solution to remove the residual resist after dry etching, thereby forming a reflective mask 701 (see FIG. 10C).

Figure 17A:
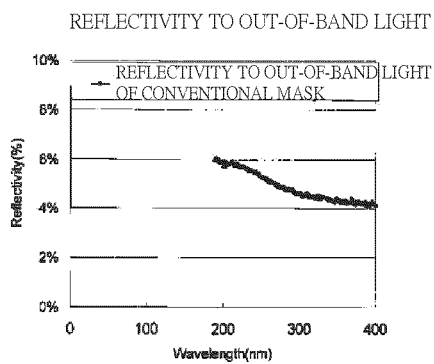
FIG. 17A is a diagram illustrating a result of reflectivity to out-of-band light of a reflective mask based on conventional art.
Figure 17B:
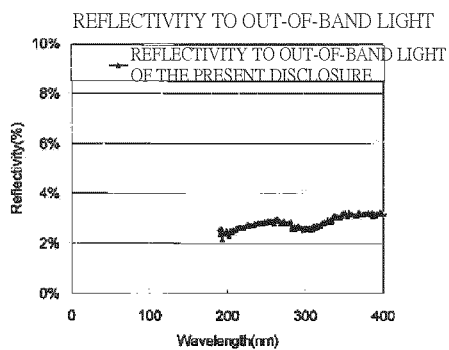
FIG. 17B is a diagram illustrating a result of reflectivity to out-of-band light of a reflective mask having a light shielding frame and an antireflective layer according to an example of the present disclosure.
Figure 18:
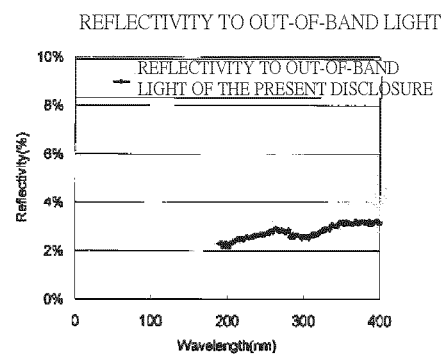
FIG. 18 is a diagram illustrating a result of reflectivity of out-of-band light of a reflective mask having a light shielding frame and an antireflective layer according to an example of the present disclosure.
Figure 19:
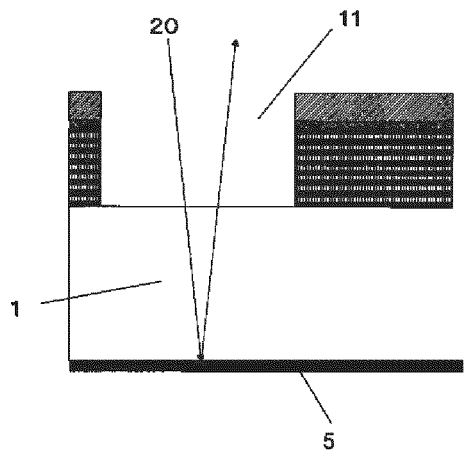
FIG. 19 is a schematic diagram illustrating reflection of out-of-band light of a mask based on conventional art.

Then, a reflective mask having a light shielding frame of conventional art, the reflective mask 701 having the light shielding frame and the antireflective layer of the present disclosure, and the reflective mask 902 having the light shielding frame and the antireflective layer of the present disclosure were obtained, followed by measurement of reflectivity in the light shielding frame region. As a result, as shown in FIGS. 17A, 17B and 18, it was confirmed that the reflectivity of the reflective mask 701 having the light shielding frame and the antireflective layer of the present disclosure (FIG. 17B) was reduced by about 40% in respect of the out-of-band light at a wavelength of 200 to 400 nm, compared with the reflectivity of the reflective mask having a light shielding frame of conventional art (FIG. 17A). Similarly, it was confirmed that the reflectivity of the reflective mask 902 having the light shielding frame and the antireflective layer of the present disclosure (FIG. 18) was reduced by about 40% in respect of the out-of-band light at a wavelength of 200 to 400 nm, compared with the reflectivity of the reflective mask having a light shielding frame of conventional art (FIG. 17A).

Further, using an electron microscope, the 1:1 line-and-space pattern with a pitch of 200 nm was observed for the reflective mask having a light shielding frame of conventional art, the reflective mask 701 having the light shielding frame and the antireflective layer of the present disclosure, and the reflective mask 902 having the light shielding frame and the antireflective layer of the present disclosure. As a result of the observation, the image of the reflective mask having a light shielding frame of conventional art alone was blurred due to charging.

In the reflective mask fabricated as described above, the reflection of the out-of-band light was reduced and the charging occurring in the observation using an electron microscope was minimized.

What is claimed is:

1. A reflective mask blank comprising:
a substrate;
a multi-layer reflective layer formed on a front surface of the substrate;
a protective layer formed on the multi-layer reflective layer; and
an absorbing layer formed on the protective layer, wherein:
the absorbing layer is provided with a circuit pattern region having an outer portion which at least partially includes a light shielding frame having low reflectivity to EUV light and out-of-band light, with the absorbing layer, the protective layer and the multi-layer reflective layer being removed from the outer portion; and
the substrate within the light shielding frame is provided thereon with an antireflective layer containing at least one of Si, Mo, Ta, Cr, Ru, Al, Ti, Zn, Su, Hf, W, Zr, and Cu, or an oxide, nitride, or oxynitride thereof, and wherein the antireflective layer has an electrical conductivity of $1\times10^4/m\Omega$ or greater.

2. The reflective mask blank according to claim 1, wherein the antireflective layer causes surface reflection in antiphase to out-of-band light reflected from a rear-surface conductive film formed on a rear surface of the substrate.

3. The reflective mask blank according to claim 1, wherein the antireflective layer causes surface reflection in antiphase to out-of-band light reflected from the front surface of the substrate.

4. A reflective mask, wherein the absorbing layer of the reflective mask blank according to claim 1 is patterned.

5. The reflective mask blank according to claim 1, wherein the antireflective layer is made by selection and adjustment of an index of refraction of a material of the antireflective layer and a thickness of the antireflective layer to satisfy conditional equation (1) below so that the light is darkened by thin-film interference for a wavelength of 140 to 400 nm other than a 13.5 nm band in which reflection is reduced, and having a function of surface reflection in antiphase to out-of-band light reflected from the front surface of the substrate, wherein equation (1) is $$2nd \cos \theta = m\lambda \quad (1),$$

wherein n is the index of refraction of the material of the antireflective layer, d is the thickness of the antireflective layer, θ is an angle of incidence of the light, λ is the wavelength of the light and m is a non-negative integer.

6. A manufacturing method for the reflective mask blank according to claim 1, wherein the antireflective layer is formed by using any of sputtering, physical vapor deposition (PVD), ion plating, and chemical vapor deposition (CVD).

7. A manufacturing method for the reflective mask blank according to claim 1, wherein the antireflective layer is formed on the substrate prior to forming the multi-layer reflective layer.

8. A manufacturing method for the reflective mask blank according to claim 1, wherein the antireflective layer is formed on exposed parts of the substrate exposed after partially removing the multi-layer reflective layer.

* * * * *